Figure 1:
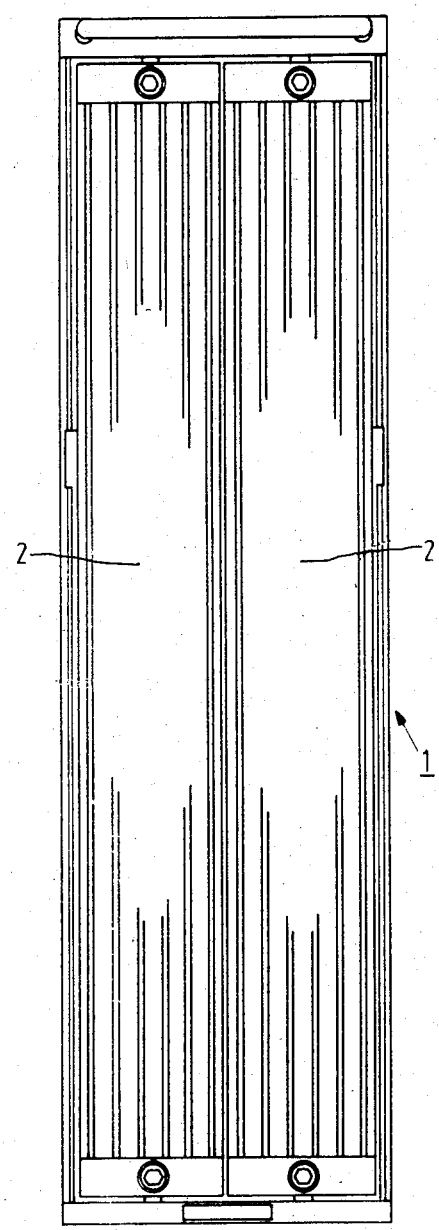

United States Patent [19]
Felsner et al.

[11] Patent Number: 4,631,638
[45] Date of Patent: Dec. 23, 1986

[54] BOX FOR HOLDING CIRCUIT BOARDS

[75] Inventors: Fritz Felsner, Leinburg; Erich Geier, Stein, both of Fed. Rep. of Germany

[73] Assignee: U.S. Philips Corporation, New York, N.Y.

[21] Appl. No.: 738,200

[22] Filed: May 24, 1985

[30] Foreign Application Priority Data

May 26, 1984 [DE] Fed. Rep. of Germany ....... 3419781

[51] Int. Cl.⁴ .............................................. H05K 7/16
[52] U.S. Cl. ................................. 361/415; 339/18 B; 339/45 M; 339/45 R; 339/75 MP; 361/399
[58] Field of Search ................ 361/392, 394, 412–415; 339/45 R, 45 M, 75 R, 75 M, 75 MP

[56] References Cited

U.S. PATENT DOCUMENTS

| | | | |
|---|---|---|---|
| 3,644,868 | 2/1972 | Nevada | 361/413 X |
| 3,691,430 | 9/1972 | Freitag | 361/415 |
| 4,109,300 | 8/1978 | Reimer | 361/415 |

FOREIGN PATENT DOCUMENTS

| | | | |
|---|---|---|---|
| 721932 | 3/1980 | Burma | 361/392 |
| 687866 | 1/1940 | Fed. Rep. of Germany | 339/45 R |
| 1262383 | 3/1968 | Fed. Rep. of Germany | 361/415 |
| 2030906 | 12/1970 | Fed. Rep. of Germany | 361/413 |
| 2002350 | 7/1971 | Fed. Rep. of Germany | 339/75 MP |

Primary Examiner—Arthur T. Grimley
Assistant Examiner—Jane K. Lau
Attorney, Agent, or Firm—Robert T. Mayer

[57] ABSTRACT

A box for holding circuit boards which box has horizontal slots at its side walls which are arranged vertically one above the other and in which a lever can be operated from the front of the box, which lever is kept movable in a slot of the side wall, is guided between a circuit board and a side wall of the box, and engages behind the circuit board by means of an operating projection.

4 Claims, 2 Drawing Figures

BOX FOR HOLDING CIRCUIT BOARDS

The invention relates to a box for telecommunication racks having on its side walls horizontal slots which are arranged vertically one above the other.

A telecommunication rack is known by the rack construction 7R in which vertical longitudinal boxes can be provided one above the other in rows with narrow racks. In the side walls of the boxes short horizontal slots are present vertically one above the other at a given spacing. If desired, guide rails for circuit boards to be provided vertically one above the other can be plugged in said slots.

The boxes are also suitable for receiving circuit boards which may also be in the form of vertically elongate narrow units (circuit boards) so that at least two of such circuit boards can be accommodated beside each other in one box. On their rear sides they are provided with connectors with which they engage mating connectors of the boxes. The circuit boards are connected in the box by means of screws at the top and at the bottom.

When taking out a circuit board the plug-in forces must also be overcome which, due to the often high number of connectors, can assume considerable values. This has for its result that a circuit board, after overcoming the plug-in forces, works loose jerkily as a result of which an uncontrolled movement of the circuit board in the box is triggered and damage may be done. Therefore, the connection screws in the circuit board may be held so that when the circuit board works loose they operate at the same time as draw-in bolts against the direction of the plug-in forces. Special draw-in bolts may also be provided. When taking out a circuit board the bolts must be actuated in a prescribed sequence in order that tilting is avoided. The actuation of said bolts is time-consuming and moreover a faulty actuation is easily possible so that tilting of the circuit board in its guide in the box occurs and the guides and connectors may be damaged.

It is the object of the invention to improve the box of the described type in such a manner that after detaching possibly present connection screws without having regard to a prescribed sequence, a circuit board can be taken out without jerks and without any particular force so that tilting is avoided.

According to the invention this object is achieved in a device of the above-described type in that a flat lever which can be operated from the front of the box and is kept so as to be movable in a slot in the side wall is guided between the circuit board and a side wall of the box and engages with its back end behind the circuit board.

Figure 2:
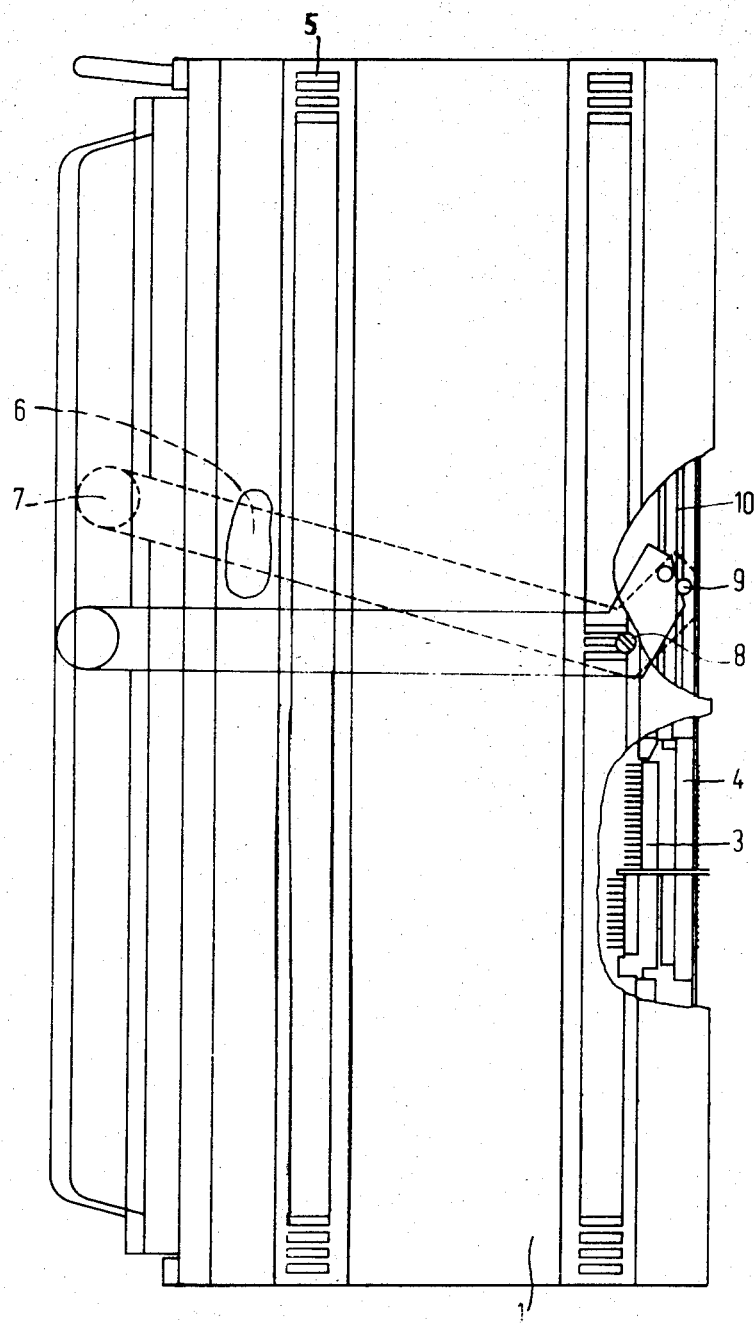

The invention will now be described in greater detail with reference to embodiments shown in the drawings, in which:

FIG. 1 is a front elevation of a box,
FIG. 2 is a side elevation of a box.

The box 1 shown in FIG. 1 for narrow racks for telecommunication equipment comprises two circuit boards 2 which are plugged into this box one beside the other. On their front they comprise cooling members with which the loss due to thermal energy given off by the components in the interior is dissipated to the atmosphere. The circuit boards are guided in guide rails in the top and bottom in the box.

FIG. 2 is a side elevation of the box. Plug-in connectors 3 engaging in mating connectors 4 on the inside of the box are provided on the rear side of the circuit board. The connectors to connect the box to the rack are not shown to avoid complexity of the drawing.

The side walls of the box comprise horizontal slots 5 which are arranged one above the other. To facilitate the detaching of a circuit board 2 a flat lever 6 is provided between the circuit board and the side wall of the box 1. Operating grip 7 of lever 6 projects from the front of the box. Fulcrum 8 of lever 6 is a screw which is held in a slot of the side wall. The screw may comprise a shoulder between its head and the screwthread the diameter of which is larger than the width of the slot so that the screw can be drawn in the slot and the lever is freely movable using the shoulder as a bearing. The axis of the lever, however, may also be loosely in the slot, the end of the slot 5 serving as an abutment. In this case it may be formed as a pin connected to the lever and secured in the side wall by means of a spring washer.

The lever engages the rear wall 10 of the box with an operating projection 9 at its end, so that upon depressing the operating grip 7 the connectors of the circuit board 2 can easily be drawn without jerks out of their mating connectors 4 in the box. The operating projection 9 is a round pin which is welded to the end of the lever. An advantageous embodiment consists in that a tubular member is provided over the pin so as to be movable with respect to the pin. As a result of this the friction with respect to the rear wall of the circuit board is further reduced.

As a result of the different construction of the circuit boards in accordance with their respective uses, the connectors on the rear sides may be distributed differently so that a different distribution of the plug-in forces is also obtained. The advantage of the invention is that this condition can simply be taken into account in that, in accordance with the type of circuit board, for the connection of the lever a certain slot of the series of vertical slots is selected. A further advantage consists in that the lever, also in devices of the type mentioned in the opening paragraph which are already in operation, can easily be provided without changing said devices.

What is claimed is:

1. A box with a front and a back for holding circuit boards, said box having horizontal slots in a side wall which slots are arranged vertically one above the other, said box including a lever which is operable from the front of the box, said lever being disposed between a circuit board held in said box and said side wall, said lever including a fulcrum disposable in said horizontal slots for movement therein and an operating projection at the end of said lever at the back of said box for engaging a circuit board to aid in the removal thereof.

2. A box as claimed in claim 1, wherein said fulcrum is a screw.

3. A box as claimed in claim 2, wherein said operating projection is a circular pin.

4. A box as claimed in claim 1, wherein said operating projection is a circular pin.

* * * * *